US010345392B2

(12) United States Patent
Kondo

(10) Patent No.: US 10,345,392 B2
(45) Date of Patent: Jul. 9, 2019

(54) METHODS AND APPARATUS FOR ESTIMATING A STATE OF HEALTH OF A BATTERY

(71) Applicant: SEMICONDUCTOR COMPONENTS INDUSTRIES, LLC, Phoenix, AZ (US)

(72) Inventor: Hideo Kondo, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 312 days.

(21) Appl. No.: 15/355,541

(22) Filed: Nov. 18, 2016

(65) Prior Publication Data

US 2018/0143262 A1    May 24, 2018

(51) Int. Cl.
*G01R 31/36* (2019.01)
*G01R 31/392* (2019.01)
*G01R 31/374* (2019.01)
*G01R 31/389* (2019.01)

(52) U.S. Cl.
CPC .......... *G01R 31/392* (2019.01); *G01R 31/374* (2019.01); *G01R 31/389* (2019.01)

(58) Field of Classification Search
None
See application file for complete search history.

(56) References Cited

U.S. PATENT DOCUMENTS

| 9,246,342 | B2* | 1/2016 | Kondo | H02J 7/0029 |
| 9,261,567 | B2* | 2/2016 | Yamada | G01R 31/3644 |
| 10,060,987 | B2* | 8/2018 | Kondo | G01R 31/3624 |
| 10,094,880 | B2* | 10/2018 | Kondo | G01R 31/362 |
| 2001/0033169 | A1* | 10/2001 | Singh | G01R 31/3662 |
| | | | | 324/426 |
| 2003/0038637 | A1* | 2/2003 | Bertness | G01R 31/3624 |
| | | | | 324/426 |
| 2012/0187917 | A1 | 7/2012 | Sugimura | |
| 2014/0306712 | A1 | 10/2014 | Esnard-Domerego | |
| 2016/0363634 | A1* | 12/2016 | Cheng | G01R 31/3648 |
| 2018/0328995 | A1* | 11/2018 | Kondo | G01R 31/3606 |

* cited by examiner

*Primary Examiner* — Jermele M Hollington
(74) *Attorney, Agent, or Firm* — The Noblitt Group, PLLC; Hettie L. Haines

(57) ABSTRACT

Various embodiments of the present technology may comprise a method and apparatus to estimate the state of health of a battery. The method and apparatus may comprise utilizing various parameters, such as RSOC, resistance, and voltage, to estimate the state of health of the battery. In various embodiments, the state of health of the battery may indicate the remaining life of the battery.

16 Claims, 5 Drawing Sheets

METHODS AND APPARATUS FOR ESTIMATING A STATE OF HEALTH OF A BATTERY

BACKGROUND OF THE TECHNOLOGY

"Battery capacity" is a measure (typically in ampere-hours) of the charge stored by the battery, and is determined by the mass of active material contained in the battery. The battery capacity represents the maximum amount of energy that can be extracted from the battery under certain specified conditions. The effective capacity of the battery (battery "state of health"), however, can vary significantly from the "nominal" rated capacity.

The effective storage capacity of the battery diminishes with age and undergoes irreversible damage. This damage is caused by corrosion and other irreversible chemical processes. Aging of the internal battery components contributes to the damage as well. The plates of the cells corrode, and as the plates corrode, their operational surface area diminishes and the electrolyte undergoes chemical changes, causing them both to be less chemically reactive. The changes reduce the volume of reactive components in the cell, reducing the charge capacity of the cell. It also increases the internal resistance of the cell, as the corrosion products inhibit the free flow of electrons through the plates. Each charge/discharge cycle of the battery also has a similar effect but at an accelerated rate. As a result, as the battery ages and deteriorates, the effective capacity of the battery decreases, reducing the time the battery can supply current to a device. In addition, the voltage level drops off faster, applying a decreasing voltage to the device.

Conventional methods for measuring the effective capacity of the battery are inefficient and prone to errors because many methods require removal of the battery from the device. Other methods require a sense resistor for measuring the current over a known time frame, which occupies a large area, is costly, and decreases performance.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates a block diagram of a battery system in accordance with an exemplary embodiment of the present technology;

FIG. 2 representatively illustrates a block diagram of a fuel gauge circuit in accordance with an exemplary embodiment of the present technology;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various temperature sensors, voltage sensors, current sensors, processing units, computations, algorithms, and the like, which may carry out a variety of functions. In addition, the present technology may be practiced in conjunction with any number of systems, such as automotive systems, emergency charging systems, and systems employed in consumer electronics and consumer wearables, and the systems described are merely exemplary applications for the technology. Further, the present technology may employ any number of conventional techniques for measuring voltage, measuring current, measuring temperature, storing data, and the like.

Figure 1:
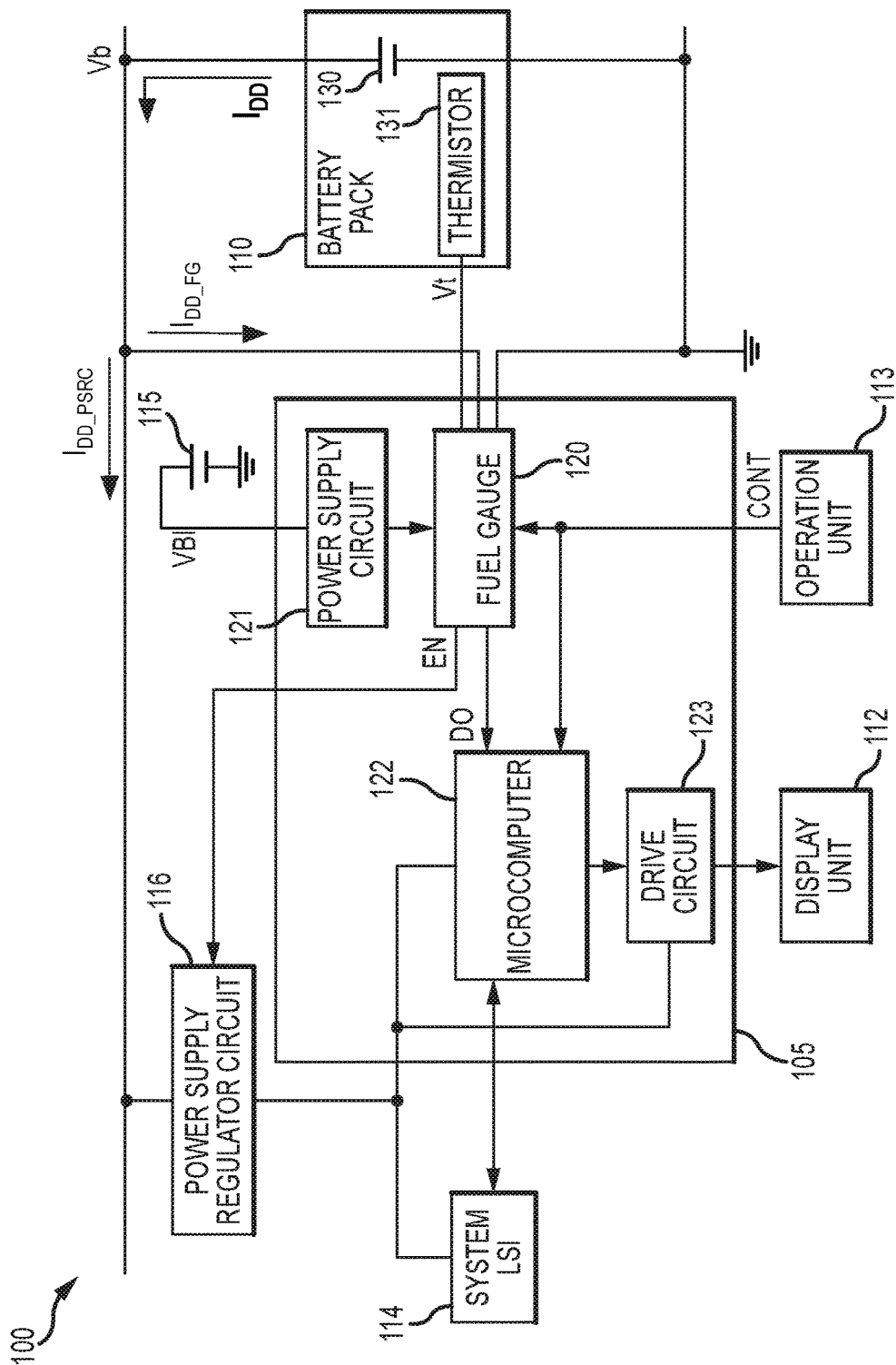

Methods and apparatus for estimating a state of health (SOH) of a battery according to various aspects of the present technology may operate in conjunction with any suitable battery-operated apparatus. For example, the apparatus may comprise a cellular phone, a computer, a tablet, or a camera. Referring to FIG. 1, in an exemplary embodiment of the present technology, methods and apparatus for estimating a state of health of a battery may operate in conjunction with a system 100, such as a cellular phone or other communication system, including a battery analysis circuit 105 and a battery pack 110. The system may also include other components, such as a display unit 112, a power supply regulator circuit 116, a system LSI (Large Scale Integration) circuit 114, and an operation unit 113. According to various embodiments, the system 100 may also comprise additional elements, such as a secondary battery 115 to operate a real-time clock circuit (not shown) and/or to update time of the system 100 when the system 100 is turned off.

The battery pack 110 may be a power supply for the system 100, and may comprise a battery 130, such as a chargeable lithium ion battery. In an exemplary embodiment, the battery 130 generates an output voltage $V_b$ between a negative electrode and a positive electrode of the battery 130.

The battery pack 110 may also comprise a temperature sensor that provides a signal according to the temperature of the battery 130. In the present embodiment, the temperature sensor comprises a thermistor 131 that generates a voltage $V_t$ which corresponds to a temperature of the battery 130. The temperature sensor may, however, comprise any appropriate sensor or other device or system for generating a signal corresponding to the temperature of the battery 130.

The display unit 112 displays information regarding the device. The display unit 112 may comprise any appropriate display for the particular application and/or environment, for example a conventional display, such as a liquid crystal panel, provided in a cellular phone to display characters, images, and the like.

The operation unit 113 provides an interface for the user to control the device, and may comprise any control interface for the particular device or application. For example, the operation unit 113 may comprise one or more buttons of various types, such as a dial key, a power key, and the like (not shown), to operate the cellular phone, and may output a control signal CONT according to the operation of the keypad. If a user manipulates the power key in the operation unit 113 to start the cellular phone, for example, the operation unit 113 generates the control signal CONT to start the cellular phone. The operation unit 113 may comprise any appropriate interface for facilitating user control, such as a conventional keypad, a touchscreen, a voice recognition system, and/or a gaze-operated input system.

The system LSI circuit 114 performs the communication functions of the device. The system LSI circuit 114 may comprise any suitable system for the particular device or application, such as cell phone communication circuits, programmable logic devices, memory devices, and the like. In the present embodiment, the system LSI circuit 114 comprises a large scale integration circuit to realize various functions, for example communication in the cellular phone.

The power supply regulator circuit (PSRC) 116 may generate one or more power supply voltages for powering the various elements of the device. For example, the power supply regulator circuit 116 may power the system LSI circuit 114 and other system elements based on the output voltage $V_b$ of the battery 130 and/or power from an external power source. The power supply regulator circuit 116 may comprise a conventional power supply regulation system for providing appropriate voltages for the various elements.

The battery analysis circuit 105 determines the state of health of the battery 130, and may do so according to any appropriate factors, including but not limited to the battery's age, internal resistance, current, voltage, relative state of charge (RSOC), and/or effective battery capacity. The battery analysis circuit 105 may comprise any suitable components for determining the battery's 130 state of health. For example, the battery analysis circuit 105 may include a microcomputer 122, a drive circuit 123, a third power supply circuit 121, and a fuel gauge circuit 120.

The microcomputer 122 may control the cellular phone, for example based on the control signal CONT received from the operation unit 113. Further, the microcomputer 122 may transfer data DO outputted from the fuel gauge circuit 120 to the drive circuit 123, which may be configured to drive the display unit 112. The drive circuit 123 may drive the display unit 112 so that the remaining capacity, the temperature of the battery 30, and the like, can be displayed on the display unit 112 based on the data DO from the microcomputer 122. The third power supply circuit 121 may generate a power supply voltage to operate the fuel gauge circuit 120, such as from the secondary battery 115. In various embodiments, the system 100 may further comprise a timing unit (not shown) to operate various circuits according to a predetermined timing cycle.

Figure 2:
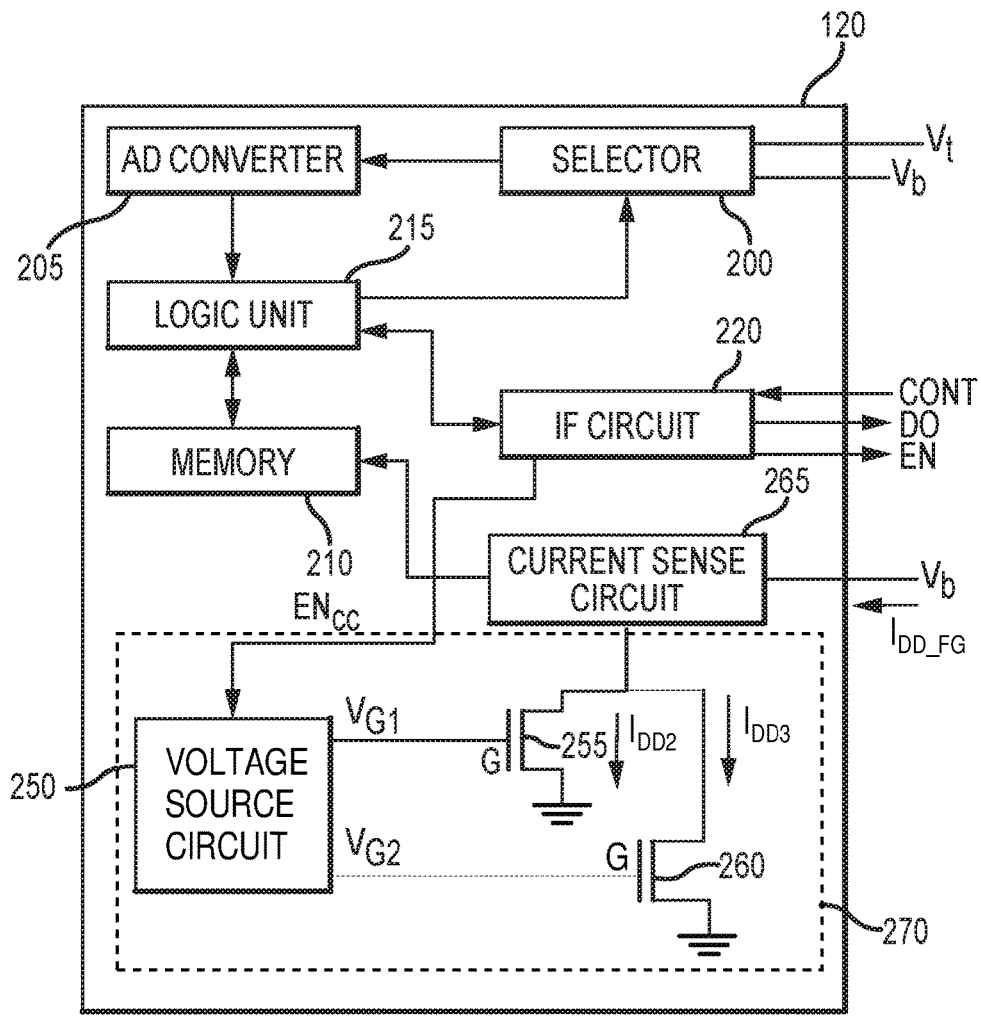

The fuel gauge circuit 120 receives various inputs, determines a state of health for the battery 130, and provides a corresponding signal. The fuel gauge circuit 120 may receive signals corresponding to the relevant criteria, such as a temperature signal from the temperature sensor 131 and a voltage signal from the battery 130, as well as control signals, such as from the operation unit 113 and/or the microcomputer 122. The fuel gauge circuit 120 may also generate signals, such as signals corresponding to the state of health of the battery 130. The fuel gauge circuit 120 may be implemented in any suitable manner, such as in the form of a large scale integrated (LSI) circuit. For example, referring to FIG. 2, one embodiment of the fuel gauge circuit 120 may comprise a logic unit 215, a current sensor 265, and a memory 210. The fuel gauge circuit 120 may further comprise a selector 200, an AD converter 205, and an interface (IF) circuit 220. The selector 200 may comprise a circuit to select the output voltage $V_b$ or voltage $V_t$, to be provided to the AD converter 205, for example based on an instruction from the logic unit 210.

The AD converter 205 may comprise a circuit to convert analog signals, such as voltage signals from the output voltage $V_b$ and thermistor voltage $V_t$ output from the selector 200, into digital values. The AD converter 205 may comprise any analog-to-digital architecture, and may be selected based on a particular application. The IF circuit 220 may comprise a circuit to exchange various data between the logic unit 215 and the operation unit 113, the power supply regulator circuit 116, and the microcomputer 122. The IF circuit 220 may also facilitate control of the voltage source circuit 250, for example via a signal $EN_{CC}$.

The current sensor 265 may measure various currents in the system 100. In an exemplary embodiment, the current sensor 265 may measure a current $I_{DD}$ through the battery 130. In the present embodiment, the current sensor 265 may measure the current $I_{DD}$ regardless of whether a load current is unknown. The current $I_{DD}$ may be measured at various times and at different time intervals.

The fuel gauge 120 may further comprise a secondary current circuit 270 to selectively produce various currents to effect a change in the output voltage $V_b$. The secondary current circuit 270 may be coupled to the current sensor 265 and may comprise any suitable circuit for selectively activating one or more secondary currents, for example the second current $I_{DD2}$ and the third current $I_{DD3}$. The secondary current circuit 270 may be coupled to the output voltage $V_b$, and may use any number of devices to generate the desired currents, such as a current source and/or a transistor. For example, the number of secondary currents may be related to the number of unknown parameters in the system, such as an internal resistance of the load.

In an exemplary embodiment, the secondary current circuit 270 comprises a first transistor 255 and a second transistor 260. The first and second transistors 255, 260 may be turned on or off to produce secondary currents. For example, the first transistor 255 may produce the second current $I_{DD2}$ when it is "on." Similarly, the second transistor 260 may produce the third current $I_{DD3}$ when is "on." When one of the transistors turns on, the change in current can be detected at the output voltage $V_b$ (node $V_b$). This added secondary current affects the output voltage $V_b$ of the battery 130, which may be measured by the fuel gauge 120. In general, a charger IC (not shown) maintains a constant current to the load, so a change in the output voltage $V_b$ does not change the current to the load. The fuel gauge 120 may measure the output voltage $V_b$ before either transistor is turned on, then again after the first transistor 255 is turned on, and again after the second transistor 260 is turned on. As such, the current IDD after both transistors are turned on can be expressed as: $I_{DD}=I_{DD\_FG}+I_{DD\_PSRC}+I_{DD2}+I_{DD3}$. Thus, the fuel gauge 120 may utilize the change in the output voltage $V_b$ as a result of the additional currents $I_{DD2}$, $I_{DD3}$ using Ohms law to compute various parameters, such as an internal resistance $R_{int}$ of the battery 130.

The secondary current circuit 270 may further comprise a voltage source circuit 250 to selectively operate (turn on or off) the first and/or second transistor 255, 260 to provide a constant current through the first and/or second transistor 255, 260. For example, the voltage source circuit 250 may provide a predetermined voltage $V_G$ to a gate terminal of each of the first and second transistors 255, 260 to allow current to flow through the each transistor 255, 260. The voltage source circuit 250 may comprise any suitable components for selectively controlling the first and second transistors 255, 260. For example, the voltage source circuit 250 may comprise operational amplifiers (not shown)

coupled to the gate terminal of each of the first transistor 255 and the second transistor 260.

The logic unit 215 may control the fuel gauge circuit 120 and realize various functions by executing various programs stored in the memory 210. For example, the logic unit 215 may perform various calculations, such as determining the internal resistance $R_{int}$ of the battery, computing the RSOC of the battery, and computing the SOH of the battery 130. The logic unit 215 may also receive information regarding the measured current $I_{DD}$ and the charge/discharge state of the battery 130, as well as data stored in the memory 210.

In an exemplary embodiment, the logic unit 215 computes the SOH of the battery 130 according to the internal resistance of the battery, such as using the following formula:

$$SOH = \frac{R_{int\_new}}{R_{int\_aged}} \times 100.$$

where $R_{int\_new}$ is the internal resistance of the battery when it is new (i.e., baseline internal resistance) and $R_{int\_aged}$ is the internal resistance of the battery after it has aged. The SOH may relate to an overall charge storage capacity of the battery, such as the cell performance of the battery.

The logic unit 215 may further interpret the SOH value and provide an indicator, such as an indicator light, message, signal, and the like, to inform the user of the SOH of the battery 130. The logic unit 215 may interpret the SOH value to indicate a general SOH and/or remaining life of the battery, for example if the battery 130 is in excellent, good, declining, or bad health. The logic unit may further indicate to a user to take some specific action, such as an indicator to replace the battery 130. For example, if the SOH has a value equal to 50%, this means that the battery 130 has lost 50% of its charge capacity and the logic unit 215 may interpret this value as a battery with declining health and indicate to the user that the battery 130 should be replaced.

Figure 3:
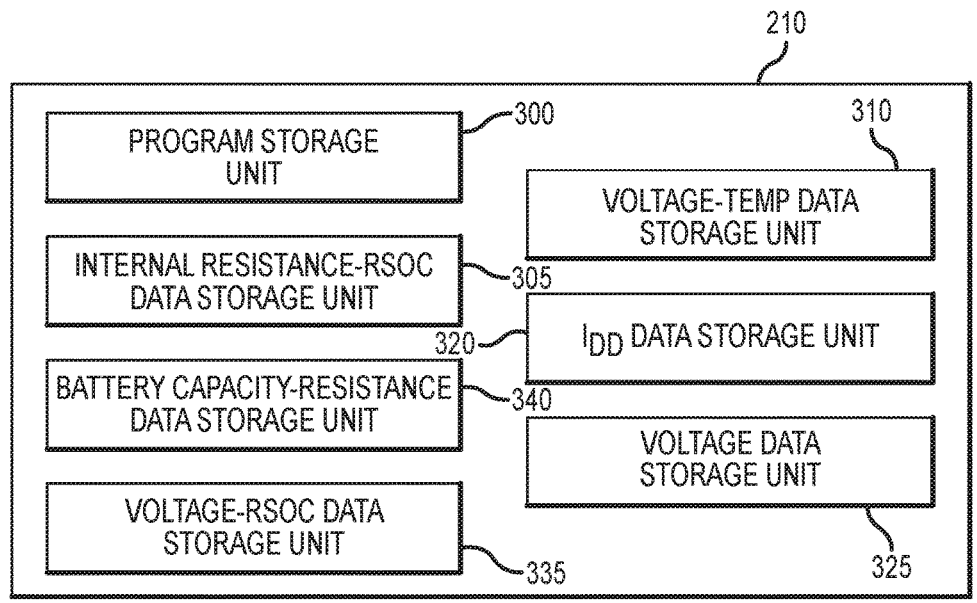
FIG. 3 is a block diagram of a memory unit in accordance with an exemplary embodiment of the present technology.

Referring to FIG. 3, the memory 210 may comprise a circuit to store programs to be executed by the logic unit 215 and various types of data. In an exemplary embodiment, the memory 210 may comprise ROM (read only memory) and RAM (random access memory). The storage area of the memory 210 may be provided with a program storage unit 300 to store programs to operate the logic unit 215.

The memory 210 may comprise an internal resistance-RSOC data storage unit 305, an effective battery capacity-resistance data storage unit 340, and a voltage-RSOC data storage unit 335 to store data used by the logic unit 215 to estimate the state of health of the battery 130. RSOC may be expressed as a ratio of the remaining capacity of the battery 130 to the total effective capacity of the battery 130.

The memory 210 may further comprise a voltage-temperature data storage unit 310 to store data indicating the relationship between the thermistor voltage $V_t$ and the temperature. The memory may further comprise a current data storage unit 320 to store the value of the current $I_{DD}$ and the charge/discharge state of the battery 130, and a voltage data storage unit 325 to store the measured output voltage $V_b$.

Figure 4:
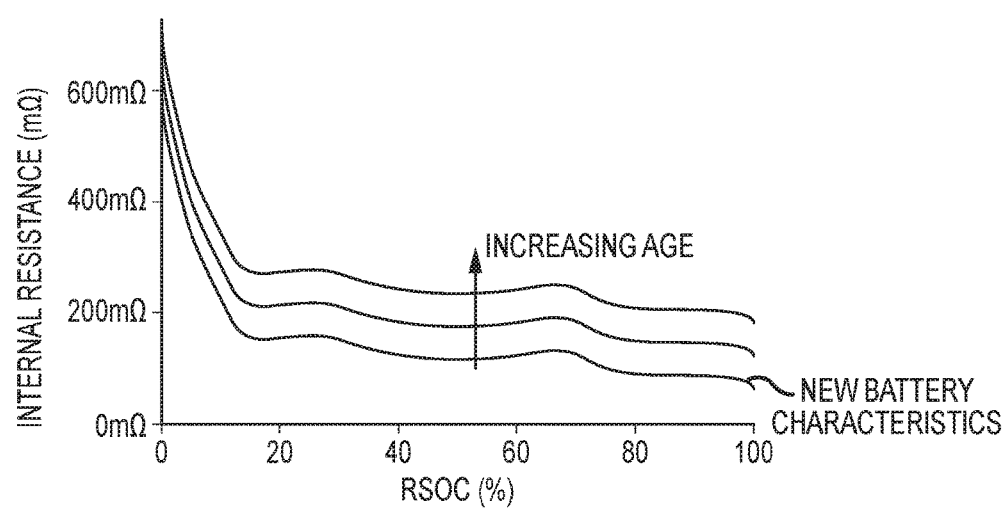
FIG. 4 is a graph illustrating a relationship between internal resistance and relative state of charge of a new battery in accordance with an exemplary embodiment of the present technology.

Referring to FIG. 4, the internal resistance-RSOC data storage unit 305 may store data indicating a relationship between the internal resistance $R_{int}$ of the battery 130 and the relative state of charge of the battery 130. The data may be stored in any suitable manner, such as in a look-up table. The data may represent the internal resistance $R_{int}$ and the RSOC characteristics when the battery 130 is new (i.e., baseline internal resistance characteristics), as well as the characteristics of the battery as it ages. In general, as the battery ages, the internal resistance $R_{int}$ increases across all values of the RSOC.

Figure 5:
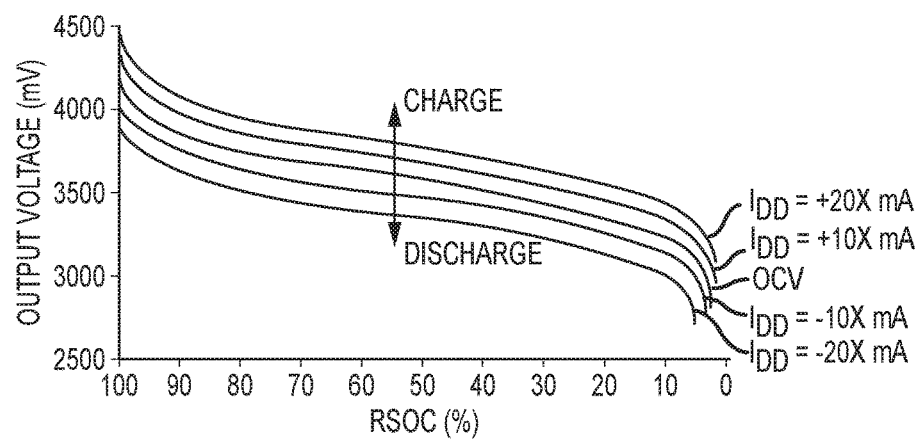
FIG. 5 is a graph indicating a relationship between voltage, current, and remaining capacity of a battery in accordance with an exemplary embodiment of the present technology.
Figure 6:
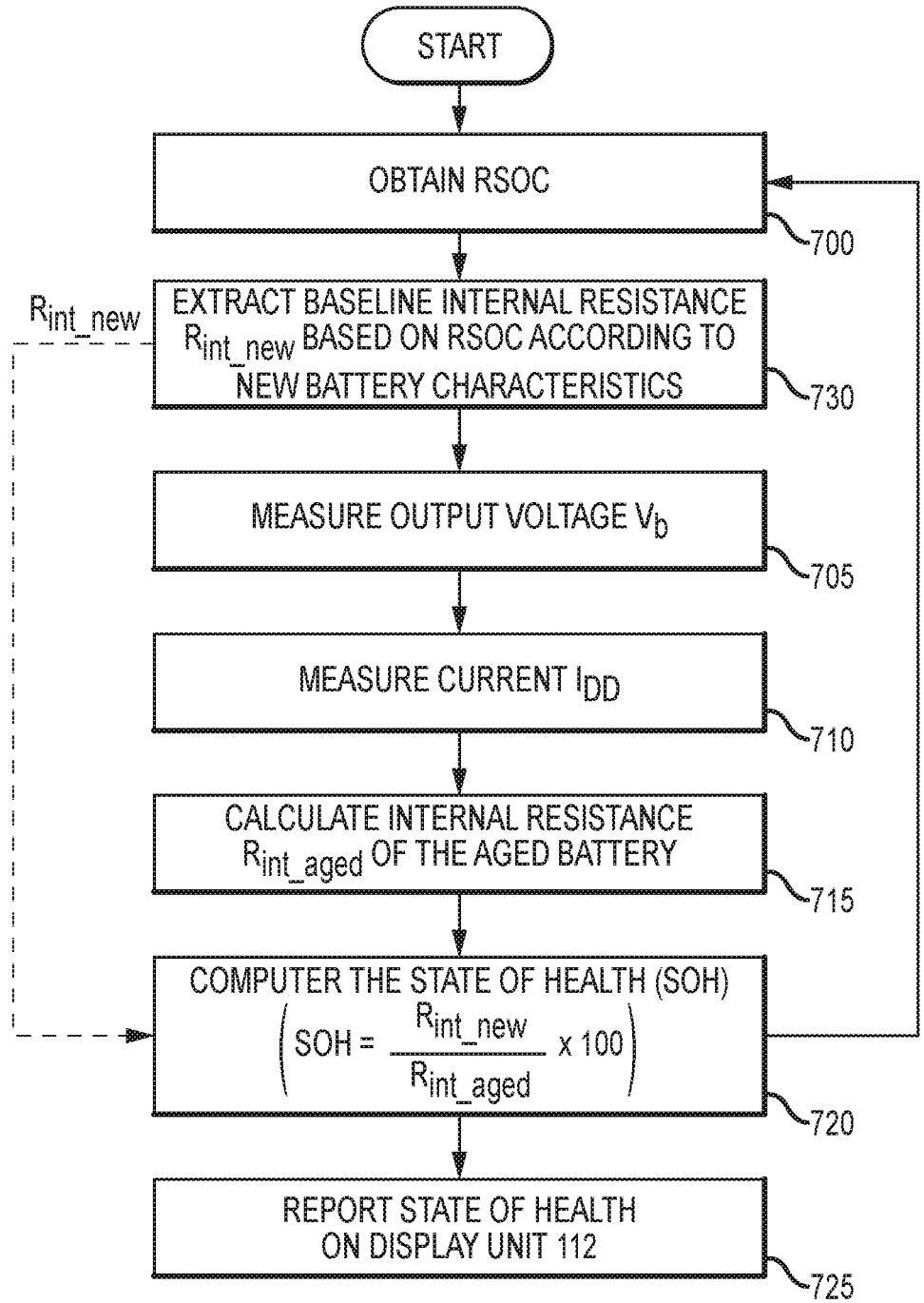
FIG. 6 is a flow chart for estimating a state of health of a battery in accordance with an exemplary embodiment of the present technology.

Referring to FIG. 5, the voltage-RSOC data storage unit 335 may store data that describes the relationship between the output voltage $V_b$ and the RSOC. For example, the data may be stored in the form of a look-up table or other suitable form. The voltage-RSOC data storage unit 335 may comprise OCV characteristics one or more specified temperatures, for example 20 degrees Celsius. When graphed, the OCV characteristics may be referred to as an OCV curve. If the battery 130 is charging, the voltage-RSOC curve may increase relative to the OCV curve, or if the battery 130 is discharging, the voltage-RSOC curve may decrease relative to the OCV curve. The amount that the voltage-RSOC curve increases or decreases relative to the OCV curve depends on the magnitude of the current $I_{DD}$. As such, the voltage-RSOC data storage unit 335 may be utilized to determine if the battery 130 is charging or discharging when the output voltage $V_b$ and the RSOC are known.

In various embodiments, the voltage-RSOC data storage unit 335 may also store current data corresponding to various current levels according to the output voltage $V_b$ and the RSOC. The fuel gauge circuit 120 may estimate the current if the output voltage $V_b$ and the RSOC are known. For example, if the output voltage $V_b$ is 4000 mV and the RSOC is 80 percent, then the fuel gauge circuit 120 may estimate the current to be +20X mA (where X is a shift factor based on the battery specifications, such as the capacity of the battery).

Referring to FIGS. 1 through 6, in operation, the fuel gauge circuit 120 may estimate the state of health of battery 130 based on various factors, such as the temperature of the battery 130, the internal resistance $R_{int\_new}$ of the battery 130 when it was new, the internal resistance $R_{int\_aged}$ of the aged battery 130, the measured voltage $V_b$, the measured current $I_{DD}$, and/or the charge/discharge state of the battery 130. According to various embodiments, the fuel gauge circuit 120 measures the current $I_{DD}$ and output voltage $V_b$ and calculates the internal resistance $R_{int\_aged}$ of the aged battery 130. The fuel gauge circuit 120 may utilize the computed RSOC of the battery, the new battery characteristics, and the calculated internal resistance $R_{int\_aged}$ of the aged battery 130 to determine the state of health of the battery 130.

The fuel gauge circuit 120 may determine the internal resistance $R_{int\_new}$ of the aged battery 130 in any suitable manner. For example, in various embodiments, the fuel gauge circuit 120 may first compute the RSOC of the battery 130 (700) using conventional methods, such as a coulomb counting method and/or a voltage estimation method. The fuel gauge circuit 120 may utilize the computed RSOC to determine the baseline internal resistance $R_{int\_new}$ of the battery 130. RSOC values may be associated with the internal resistance of the battery as the battery ages. As such, the fuel gauge 120 may utilize the computed RSOC, according to the new battery characteristic curve (730), to find the internal resistance associated with that particular RSOC value. For example, the fuel gauge 120 may retrieve the internal resistance value from a look-up table containing internal resistance-RSOC data, such as the data from the internal resistance-RSOC data storage unit 305. For example, referring to FIG. 4, if the calculated RSOC is 50%, then the corresponding baseline internal resistance $R_{int\_new}$ of the battery is approximately 150 m-ohms.

Referring again to FIG. 6, the fuel gauge circuit 120 may measure the output voltage $V_b$ of the battery 130 (705). For example, the selector 200 may receive the output voltage $V_b$ of the battery 130 and convert the voltage to a digital value via the AD converter 205. A digital value representing the output voltage $V_b$ may be transmitted to the logic unit 215. The digital value may also be stored in the voltage data storage unit 325. The fuel gauge circuit 120 may utilize the output voltage $V_b$ and the computed RSOC to determine if the battery 130 is in the charge state or the discharge state, for example by accessing the voltage-RSOC data storage unit and determining whether the battery 130 is charging or discharging according to the computed RSOC and the output voltage $V_b$.

The current sensor 265 may measure the current $I_{DD}$ (710), such as after the output voltage $V_b$ is measured. The current $I_{DD}$ may be measured to determine a numerical current value. In various embodiments, the current $I_{DD}$ is measured only if the battery 130 is in the discharge state because the current is stabilized by the charger IC during the discharge state. In general, when the charging IC is charging the battery 130, the charging current may vary according to a charge mode of the charger IC. For example, during a constant charge mode, the charger IC may charge the battery 130 according to a constant current level, and during a constant voltage charge mode, the charger IC may charge the battery according to a constant voltage level, where the current is decreasing.

The fuel gauge circuit 120 may determine the internal resistance $R_{int\_aged}$ of the aged battery 130 as well. The aged internal resistance $R_{int\_aged}$ may be measured in any suitable manner, such as by calculating the voltage change in the battery 130 required to drive current through the secondary current circuit 270. For example, in an exemplary embodiment, the first and second transistors 255, 260 may be operated independently to control the current $I_{DD}$. The IF circuit 220 may transmit the signal $EN_{CC}$ to the voltage source circuit 250, wherein the voltage source circuit 250 may apply a first gate voltage $V_{G1}$ to the first transistor 255 and/or apply a second gate voltage $V_{G2}$ to the second transistor 260.

When the first transistor 255 is turned on (by applying the first gate voltage $V_{G1}$) the first transistor 255 acts as an independent current source to deliver a constant current. The first transistor 255 may draw from the current entering the fuel gauge circuit 120 and provides a second current $I_{DD2}$. The fuel gauge 120 may measure the output voltage $V_b$ before either transistor is turned on, and again after each transistor is turned on. The additional current drawn by the first transistor 255 increases the output voltage $V_b$ of the battery 130 and a new output voltage $V_{b\_new}$ may described as: $V_{b\_new}=V_b+\Delta V_{255}$, where $\Delta V_{255}$ is the change in the output voltage as a result of the first transistor 255 being on. Therefore, the internal resistance $R_{int\_aged}$ may be described by: $R_{int\_aged}=\Delta V_{255}/I_{DD2}$.

Similarly, when the second transistor 260 is also turned on (by applying the second gate voltage $V_{G2}$), the second transistor 260 also acts an independent current source to deliver a constant current. The second transistor 260 may also draw from the current entering the fuel gauge circuit 120 and provides a third current $I_{DD3}$. The additional current provided by the second transistor 260 further increases the output voltage $V_b$ of the battery 130 and a new output voltage $V_{b\_new}$ may described as: $V_{b\_new}=V_b+\Delta V_{255}+\Delta V_{260}$, where $\Delta V_{260}$ is the change in the output voltage as a result of the second transistor 260 being on. Therefore, the internal resistance $R_{int\_aged}$ may be described by: $R_{int\_aged}=\Delta V_{255}+\Delta V_{260}/I_{DD2}+I_{DD3}$.

The current sense circuit 265 may measure the current $I_{DD}$ (e.g., $I_{DD2}$ and/or $I_{DD3}$) and transmit the current data $I_{DD}$ to the memory 210, where it may be stored by the current data storage unit 320.

Once the output voltage $V_b$ and the current $I_{DD}$ are obtained, the internal resistance $R_{int\_aged}$ of the aged battery 130 may be calculated (715). For example, the logic unit 215 may extract the output voltage $V_{b\_new}$ (where $V_{b\_new}=V_b+\Delta V_{255}+\Delta V_{260}$ in the case where both transistors 255, 260 are utilized, or $V_{b\_new}=V_b+\Delta V_{255}$ in the case where only the first transistor 255 is on) and the current $I_{DD}$ from the memory 210 and calculate the internal resistance $R_{int\_aged}$ of the aged battery (i.e., $R_{int\_aged}=V_b/I_{DD}$, where $I_{DD}=I_{DD\_PSRC}+I_{DD\_FG}+I_{DD2}$, or $I_{DD}=I_{DD\_PSRC}+I_{DD\_FG}+I_{DD2}+I_{DD3}$).

The logic unit 215 may then compute the SOH of the battery 130 utilizing the computed internal resistance $R_{int\_aged}$ of the aged battery and the internal resistance $R_{int\_new}$ according to the new battery characteristics (720). In an exemplary embodiment, the logic unit 215 computes the SOH according to the formula above. In various embodiments, the logic unit 215 may further convert the SOH value to a general indication of the state of health of the battery 130, such as "good," "bad," etc. The battery analysis circuit 105 may then transmit the state of health to the display unit 112 (725) to provide an indicator to inform the user of the general indicator and/or specific instructions, such as whether or not to replace the battery 130.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for estimating a state of health of a battery, comprising:
   a voltage sensor responsive to an output voltage of the battery;
   a current sensor responsive to a current of the battery;
   a secondary current circuit coupled to the current sensor and comprising:
      a first transistor and a second transistor coupled in parallel; and
      a voltage source circuit to selectively operate the first and second transistors by applying a predetermined constant voltage to each of the first and second transistors; and
   a logic unit responsive to the voltage sensor and the current sensor, wherein the logic unit is configured to:
      determine a baseline internal resistance of the battery;
      calculate an aged internal resistance of the battery based on the current and the output voltage; and
      estimate the state of health of the battery based on the baseline internal resistance and the aged internal resistance.

2. The apparatus according to claim 1, wherein the logic unit is configured to:
   determine whether the battery is charging or discharging; and
   estimate the state of health of the battery only if the battery is discharging.

3. The apparatus according to claim 2, further comprising:
   a memory device responsive to the logic unit and storing a first battery characteristic indicating a relationship between the voltage and a relative state of charge of the battery; and
   wherein the logic unit is configured to determine whether the battery is charging or discharging according to the relative state of charge of the battery, the voltage, and the first battery characteristic.

4. The apparatus according to claim 1, wherein the logic unit is configured to determine the baseline internal resistance of the battery according to the relative state of charge of the battery.

5. The apparatus according to claim 4, further comprising:
   a memory device responsive to the logic unit and storing a second battery characteristic indicating a relationship between an internal resistance and a relative state of charge of the battery; and
   wherein the logic unit is configured to determine the baseline internal resistance of the battery according to the relative state of charge of the battery and the second battery characteristic.

6. The apparatus according to claim 1, further comprising a temperature sensor coupled to the logic unit and responsive to a temperature of the battery, wherein the logic unit is configured to adjust the aged internal resistance of the battery according to the temperature of the battery.

7. A method for determining a state of health of a battery comprising:
   measuring an output voltage of the battery;
   measuring a current of the battery;
   calculating an aged internal resistance of the battery based on the current and the output voltage;
   applying a secondary current to the battery, wherein applying the secondary current comprises applying a voltage to at least one of a first transistor and a second transistor coupled in parallel and maintaining the current through the first transistor and the second transistor at a constant level; and
   estimating the state of health of the battery based on the aged internal resistance.

8. The method of claim 7, further comprising:
   determining a relative state of charge of the battery;
   determining a baseline internal resistance of the battery based on the relative state of charge of the battery; and
   estimating the state of health of the battery based on the calculated aged internal resistance and the baseline internal resistance of the battery.

9. The method of claim 7, further comprising determining a battery condition, wherein the battery condition is one of a charging state and a discharging state.

10. The method of claim 9, wherein the current is measured only if the state of charge of the battery is a discharging state.

11. The method of claim 7, further comprising:
    measuring a temperature of the battery; and
    adjusting the aged internal resistance based on the temperature.

12. A system for indicating a state of health of a battery, comprising:
    a voltage sensor responsive to an output voltage of the battery;
    a memory device storing:
       predetermined first battery characteristic data indicating a relationship between the voltage and a relative state of charge of the battery;
       predetermined second battery characteristic data indicating a relationship between a baseline internal resistance and a relative state of charge of the battery;
    a current sensor responsive to a current of the battery;
    a secondary current circuit coupled to the current sensor to effect a change in the output voltage; and comprising a first transistor and a second transistor coupled in parallel with each other; and
    a logic unit responsive to the voltage sensor, the temperature sensor, and the current sensor and having access to the memory device, wherein the logic unit is configured to:

determine the relative state of charge of the battery;

determine the baseline internal resistance of the battery according to the relative state of charge and the second battery characteristic data;

calculate an aged internal resistance of the battery based on the current and the output voltage; and estimate the state of health of the battery based on the baseline internal resistance and the aged internal resistance; and a display unit coupled to the logic unit to display the state of health of the battery, wherein the display unit displays at least one of: a general indicator and a specific indicator related to the state of health of the battery.

13. The system according to claim 12, wherein the secondary current circuit further comprises a voltage source circuit to selectively operate the first and second transistors by applying a predetermined constant voltage to each of the first and second transistors.

14. The system according to claim 12, further comprising a temperature sensor coupled to the logic unit and responsive to a temperature of the battery, wherein the logic unit is configured to adjust the aged internal resistance of the battery according to the temperature of the battery.

15. The system according to claim 12, wherein the second battery characteristic data comprises data describing the internal resistance of the battery as the battery ages.

16. The system according to claim 12, wherein the logic unit is further configured to:

determine whether the battery is in the charge state or a discharge state according to the output voltage and the relative state of charge of the battery; and measure the current only if the battery is in the discharge state.

* * * * *